(12) United States Patent
Kim

(10) Patent No.: US 12,108,654 B2
(45) Date of Patent: Oct. 1, 2024

(54) POLYMER SOLAR CELL HAVING CATHODE BUFFER LAYER INCLUDING ACID DERIVATIVE-ADDED CONJUGATE POLYMER ELECTROLYTE

(71) Applicant: PUKYONG NATIONAL UNIVERSITY INDUSTRY-UNIVERSITY COOPERATION FOUNDATION, Busan (KR)

(72) Inventor: Joo Hyun Kim, Busan (KR)

(73) Assignee: Pukyong National University Industry-University Cooperation Foundation, Busan (KR)

( * ) Notice: Subject to any disclaimer, the term of this patent is extended or adjusted under 35 U.S.C. 154(b) by 0 days.

(21) Appl. No.: 18/048,152

(22) Filed: Oct. 20, 2022

(65) Prior Publication Data

US 2023/0120873 A1 Apr. 20, 2023

Related U.S. Application Data

(63) Continuation of application No. PCT/KR2021/001426, filed on Feb. 3, 2021.

(30) Foreign Application Priority Data

Apr. 24, 2020 (KR) .......................... 10-2020-0049961

(51) Int. Cl.
H10K 85/10 (2023.01)
H10K 30/10 (2023.01)

(52) U.S. Cl.
CPC ........... *H10K 85/115* (2023.02); *H10K 30/10* (2023.02)

(58) Field of Classification Search
CPC .............................. H10K 85/115; H10K 30/10
See application file for complete search history.

(56) References Cited

FOREIGN PATENT DOCUMENTS

| CN | 105103325 A | * 11/2015 | ......... H01L 51/0039 |
|---|---|---|---|
| CN | 105470398 A | 4/2016 | |
| CN | 106589325 A | 4/2017 | |
| CN | 108242506 A | 7/2018 | |
| KR | 10-2011-0078701 A | 7/2011 | |

(Continued)

OTHER PUBLICATIONS

English Machine Translation of CN105103325 (Year: 2015).*

(Continued)

*Primary Examiner* — Kourtney R S Carlson
(74) *Attorney, Agent, or Firm* — Knobbe, Martens, Olson & Bear, LLP

(57) ABSTRACT

A polymer solar cell including a cathode buffer layer (CBL) is proposed. the CBL may include a reaction product between a conjugate polymer electrolyte and an acid derivative, the conjugate polymer electrolyte is poly [(9,9-bis 3'-(N,N-dimethylamino) propyl)-2,7-fluorene)-alt-2,7-(9,9-dihexylfluorene)] (PFN), and the acid derivative is trifluoroacetic acid (CF3AA), 4-trifluoromethyl benzoic acid (CF3BA), or 4-toluene sulfonic acid (TsOH). The CBL including the conjugate polymer electrolyte (PFN) modified with a specific acid derivative may improve short-circuit current ($J_{sc}$) and a filling factor (FF) simultaneously, and thus, significantly improved efficiency is exhibited.

3 Claims, 10 Drawing Sheets

(56) References Cited

FOREIGN PATENT DOCUMENTS

| KR | 10-2013-0027213 A | 3/2013 | |
|---|---|---|---|
| KR | 10-2014-0042745 A | 4/2014 | |
| WO | WO-2013172175 A1 * | 11/2013 | ......... H01L 51/0032 |
| WO | WO-2015169243 A1 * | 11/2015 | ............. C09D 11/52 |

OTHER PUBLICATIONS

English Machine Translation of WO 2015169243 A1 (Year: 2015).*
International Search Report mailed May 17, 2021 in International Application No. PCT/KR2021/001426.
Jin et al., "Effect of conjugated polymer electrolytes with diverse acid derivatives as a cathode buffer layer on photovoltaic properties", *Journal of Materials Chemistry,* Feb. 3, 2020, vol. 8, No. 8, pp. 4562-4569.
Po et al., "The role of buffer layers in polymer solar cells", *Energy and Environmental Science,* 2011, vol. 4, No. 2, pp. 285.310.
Wu et al., "Zinc oxide: Conjugated polymer nanocomposite as cathode buffer layer for solution processed inverted organic solar cells", *Solar Energy Materials & Solar Cells,* 2015, vol. 141, pp. 248-259.

* cited by examiner

POLYMER SOLAR CELL HAVING CATHODE BUFFER LAYER INCLUDING ACID DERIVATIVE-ADDED CONJUGATE POLYMER ELECTROLYTE

CROSS-REFERENCE TO RELATED APPLICATIONS

This application is a continuation application, and claims the benefit under 35 U.S.C. § 120 and § 365 of PCT/KR2021/001426, filed on Feb. 3, 2021, which claims priority to Korean Patent Application No. 10-2020-0049961 filed on Apr. 24, 2020, both of which are hereby incorporated by reference in their entirety.

BACKGROUND

Technical Field

The present disclosure relates to a polymer solar cell having a cathode buffer layer between a photoactive layer and a cathode.

Description of Related Technology

Research on a method of manufacturing polymer solar cells (PSCs) using polymer organic matter as an alternative to silicon solar cells is being actively conducted. Polymer solar cells have excellent processability, versatility, and lightness. The polymer solar cells are also advantageous in many aspects: low material cost, applicable to flexible devices, and simple in manufacturing method.

SUMMARY

One aspect is a polymer solar cell including a cathode buffer layer (CBL) including a conjugated polymer electrolyte (CPE) to which an acid is added to improve cell performance. Another aspect is a polymer solar cell including a cathode buffer layer (CBL) being made of a reaction product of a conjugate polymer electrolyte and a an acid derivative, in which the conjugated polymer electrolyte is poly[(9,9-bis (3'-(N,N-dimethylamino)propyl)-2,7-fluorene)-alt-2,7-(9,9-dihexylfluorene)] (PFN), and the acid derivative is trifluoroacetic acid (CF3AA), 4-trifluoromethylbenzoic acid (CF3BA), or 4-toluene sulfonic acid (TsOH).

In this case, the reaction between the PFN and the acid derivative is performed according to a chemical reaction formula shown below. In the reaction, it is preferable to synthesize the PFN modified with the acid derivative by reacting 1 equivalent of the acid derivative with the PFN.

(In the above reaction, A-H is

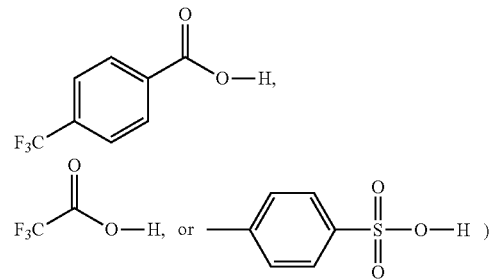

On the other hand, the polymer solar cells according to the present disclosure are not particularly limited in terms of the stacking structure and the materials of the respective layers if the buffer layer is included between the cathode and the photoactive layer.

For example, the polymer solar cell may be an inverted polymer solar cell (iPSC) composed of a cathode formed on a transparent substrate, a buffer layer including PFN modified with an acid derivative, a photoactive layer having an electron acceptor and an electron donor, and an anode.

More specifically, the substrate may be made of a transparent material having a high light transmittance. Examples of the substrate include glass, polycarbonate, polymethylmethacrylate, polyethyleneterephthalate, polyamide, and polyethersulfone.

The photoactive layer may be formed as a bilayer or heterojunction structure of a mixture including an electron donor capable of easily forming excitons due to excellent photoreactivity and an electron acceptor having high electron affinity.

The electron donor may be a conjugated polymer such as polythiophene, carbazole, benzothiadiazole, cyclopentadithiophene, diketopyrrolopyrrole, or the like.

The electron acceptor may be a fluorene derivative such as C60, C70, C76, C78, C82, C90, C94, C96, C720, or C860, having high electron affinity. Examples of the fluorene derivative include $PC_{61}BM$, $PC_{71}BM$, C84-PCBM, and bis-PCBM.

The anode and cathode may be made of a metal oxide such as indium tin oxide (ITO), $SnO_2$, $In_2O_3$—ZnO (IZO), aluminum doped ZnO (AZO), gallium doped ZnO (GZO), aluminum (Al). Alternatively, the anode and cathode may be made of: a transition metal such as silver (Ag), gold (Au), platinum (Pt); a rare earth metal; or a semimetal such as selenium (Se). Preferably, the anode and the cathode may be formed taking into account a work function.

A specific example of the inverted-type polymer solar cell according to the present disclosure is a polymer solar cell in which an ITO substrate; a zinc oxide (ZnO) layer; a buffer

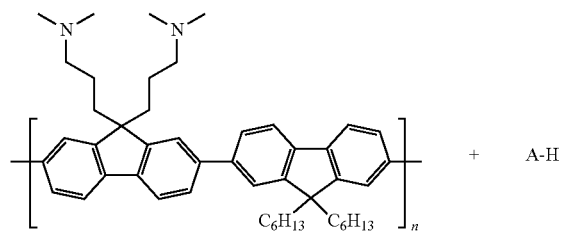 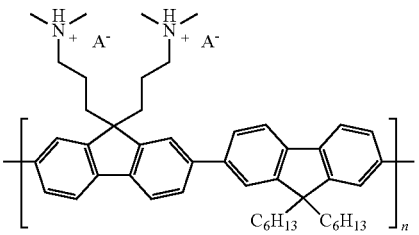

layer including PFN modified with an acid derivative; an active layer including poly ([2,6'-4,8-di(5-ethylhexylthienyl) benzo[1,2-b;3,3-b]dithiophene]{3-fluoro-2[(2-ethylhexyl)carbonyl]thieno [3,4-b]thiophenediyl})(PTB7-Th) and ([6,6]-phenyl C71 butyric acid methyl ester ($PC_{71}BM$); a molybdenum oxide ($MoO_3$) layer; and a silver (Ag) electrode layer are stacked in this order.

The polymer solar cell (PSC) according to the present disclosure is improved in both the short-circuit current ($J_{sc}$) and the filling factor (FF) due to the cathode buffer layer made of a conjugated polymer electrolyte (PFN) modified with a specific acid derivative. Thus, the PSC according to the present disclosure exhibits significantly improved power conversion efficiency.

BRIEF DESCRIPTION OF THE DRAWINGS

FIGS. 3A-3C show spectra of ZnO and ZnO/PFN added with 1 eq. of an acid derivative (AA, CF3BA, CF3AA, or TsOH), in which FIG. 3A is an XPS survey spectrum, FIG. 3B is an F1s spectrum, and FIG. 3C is an S2P spectrum.

FIG. 4A and FIG. 4B show current density-voltage curves of PSCs respectively based on ZnO and ZnO/PFN, in which FIG. 4A represents a current density-voltage curve under illumination and FIG. 4B represents a current density-voltage curve in a dark state.

FIG. 6A and FIG. 6B show graphs of PSCs respectively based on ZnO and ZnO/PFN, in which FIG. 6A illustrates a graph showing $J_{sc}$ according to light intensity, and FIG. 6B illustrates a graph showing $V_{oc}$ according to light intensity.

DETAILED DESCRIPTION

Figure 1:
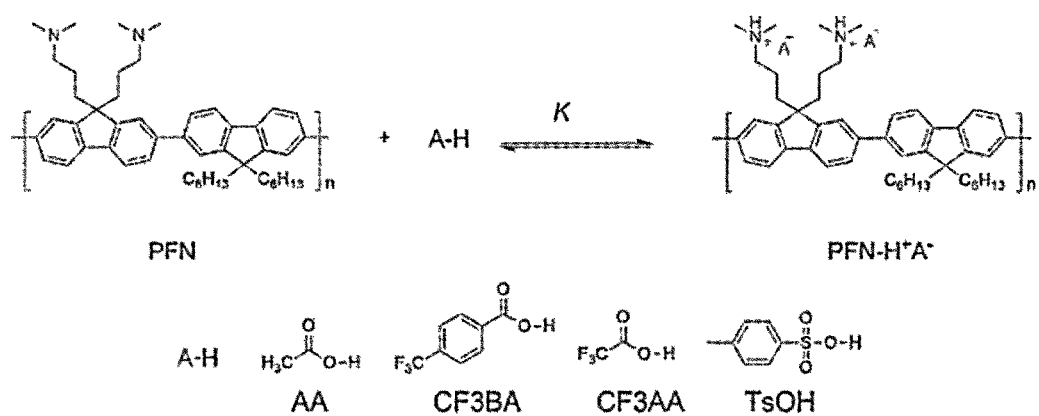
FIG. 1 shows a reaction formula between PFN and an acid derivative.

A polymer solar cell is primarily composed of a conjugated polymer organic material, a transparent inorganic electrode, and a metal cathode. However, a polymer solar cell using a conjugated polymer organic material as a photoactive layer has the problem of low photoelectric efficiency due to a high Schottky barrier between the photoactive layer and the cathode. Therefore, it is required to solve the problem.

In describing the present disclosure, well-known functions or constructions will not be described in detail when it is determined that they may obscure the gist of the present disclosure.

Since embodiments in accordance with the concept of the present disclosure can undergo various changes and have various forms, only some specific embodiments are illustrated in the drawings and described in detail in the present specification. While specific embodiments of the present disclosure are described herein below, they are only for illustrative purposes and should not be construed as limiting to the present disclosure. Thus, the present disclosure should be construed to cover not only the specific embodiments but also cover all modifications, equivalents, and substitutions that fall within the concept and technical spirit of the present disclosure. The terminology used herein is for the purpose of describing particular embodiments only and is not intended to limit the scope of the present disclosure. As used herein, the singular forms "a", "an", and "the" are intended to include the plural forms as well unless the context clearly indicates otherwise. It will be further understood that the terms "comprise" or "has" when used in the present specification specify the presence of stated features, regions, integers, steps, operations, elements and/or components, but do not preclude the presence or addition of one or more other features, regions, integers, steps, operations, elements, components and/or combinations thereof.

Hereinafter, the present disclosure will be described in detail with reference to examples.

Example

1. Synthesis of PFN Modified with Acid Derivative as CBL Material

As illustrated in FIG. 1, poly[(9,9-bis(3'-(N,N-dimethylamino)propyl)-2,7-fluorene)-alt-2,7-(9,9-dihexylfluorene)] (PFN) was reacted with various acid derivatives such as acetic acid (AA), trifluoroacetic acid (CF3AA), 4-trifluoromethyl benzoic acid (CF3BA), and 4-toluene sulfonic acid (TsOH) to prepare PFNs modified with an acid. Polymer solar cells were manufactured using the prepared PFNs as cathode buffer layer (CBL) materials, and the properties of the cells were examined.

The equilibrium constant K of the reaction (see FIG. 1) between the acid derivative and the PFN can be obtained according to the following equation:

$$K=10^{(pK_a(PFN\text{-}H^+A^-)-pK_a(A\text{-}H))}$$

In the equation, $pK_a(A\text{-}H)$ is a $pK_a$ value of an acid derivative, and $pK_a(PFH\text{-}H^+A^-)$ is a $pK_a$ value of $PFH\text{-}H^+$. Assuming that $PFH\text{-}H^+$ is equivalent to a trialkylammonium salt and has a $pK_a$ value of 10.75, the K values of the acid-base reaction between each of several acid derivatives and PFN are $1.0\times10^6$, $1.2\times10^7$, $3.3\times10^{10}$, and $3.6\times10^{13}$ for AA, CF3BA, CF3AA, and TsOH, respectively. It was confirmed that all trialkylamines of the side chains were completely converted to the trialkylammonium salts by addition of acid derivatives such as AA, CF3BA, CF3AA, and TsOH.

2. Fabrication of Polymer Solar Cell (PSC)

Figure 2:
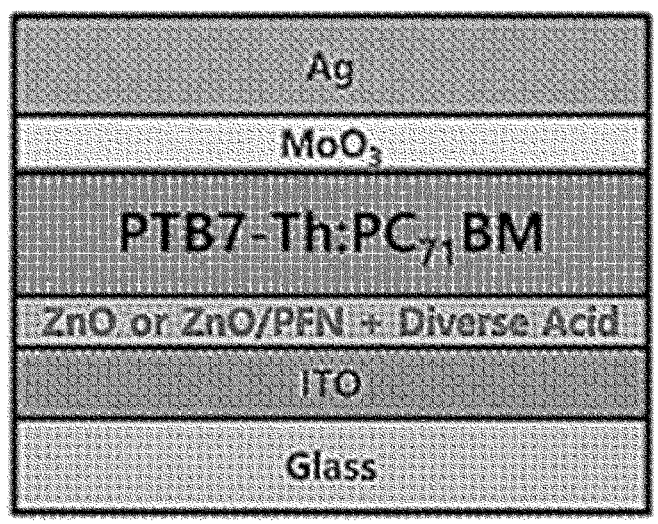
FIG. 2 is a schematic diagram illustrating a device structure of an inverted-type polymer solar cell manufactured according to one embodiment of the present disclosure.

As illustrated in FIG. 2, an inverted-type polymer solar cell made of a stack of ITO/ZnO (25 nm) with or without PFN and acid derivative/active layer (PTB7-Th:$PC_{71}BM$) (70 nm)/$MoO_3$ (3 nm)/Ag (100 nm) was fabricated.

First, the ZnO layer was deposited in a sol-gel process on the ITO. Zinc acetate dihydrate (0.1 g) and ethanolamine (0.025 ml) were dissolved in methoxyethanol (1 ml) and stirred at 60° C. for 12 hours to obtain a ZnO sol-gel precursor solution. The solution was applied onto the ITO by spin coating at a speed of 4000 rpm and cured at 200° C. for 10 minutes to form the ZnO thin film.

Next, 10 mg of poly([2,6'-4,8-di(5-ethylhexylthienyl) benzo[1,2-b;3,3-b]dithiophene]{3-fluoro-2[(2-ethylhexyl) carbonyl]thieno[3,4-b]thiophenediyl}) (PTB7-Th) and 15 mg of ([6,6]-phenyl C71 butyric acid methyl ester (PC 71BM) were dissolved in 1 mL of chlorobenzene containing 3% (v/v) 1,8-diiodooctane (DIO) to obtain a solution of PTB7-Th and $PC_{71}BM$. The blend solution was spin-casted at 1800 rpm for 120 seconds to form the active layer. Prior to the spin coating, the active solution was filtered with a 0.45-μm membrane filter. The $MoO_3$ layer and the Ag layer were successively heat deposited through a shadow mask having a device area of 0.09 $cm^2$ at $2\times10^{-6}$ Torr.

3. Fabrication of Single Electron-Only Device

To examine electron mobility in a device, a single electron-only device made of a stack of ITO/ZnO (25 nm) with or without PFN and acid derivative/$PC_{71}BM$) (70 nm)/Ag (100 nm) was fabricated.

First, the $PC_{71}BM$ layer was formed through spin-casting from a $PC_{71}BM$ solution containing chloroform as a solvent on an ITO/ZnO substrate containing or not containing PFN-acid derivative. Prior to the spin coating, the $PC_{71}BM$ solution was filtered with a 0.45-μm membrane filter. The Al layer was deposited through a shadow mask with a device area of 0.09 cm².

Experimental Example

Figure 3A:
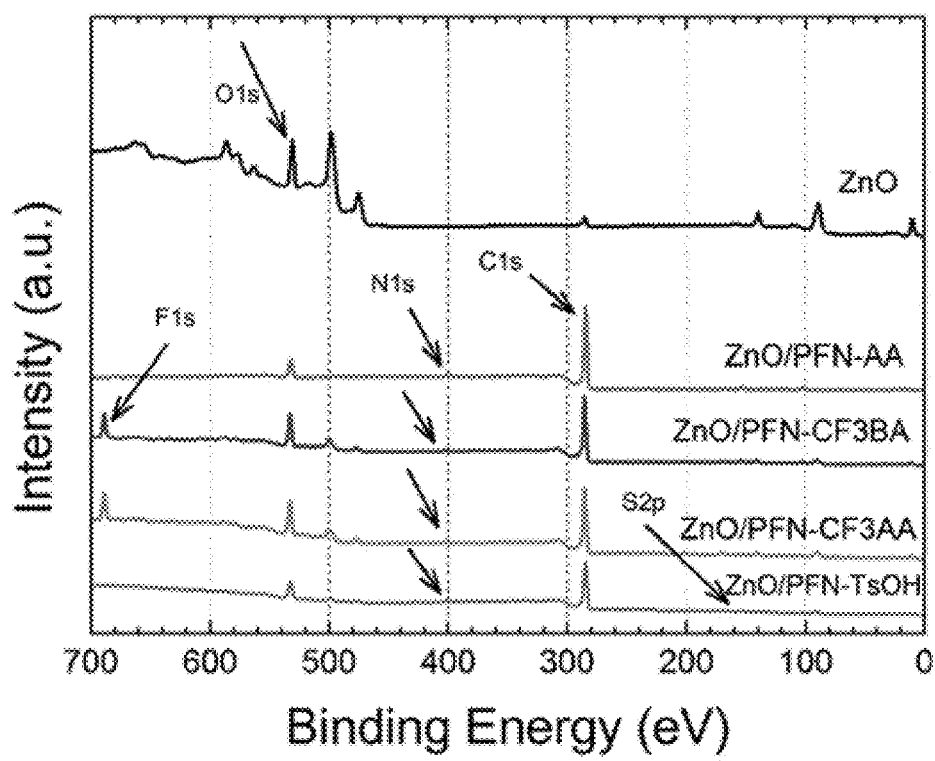
Figure 3B:
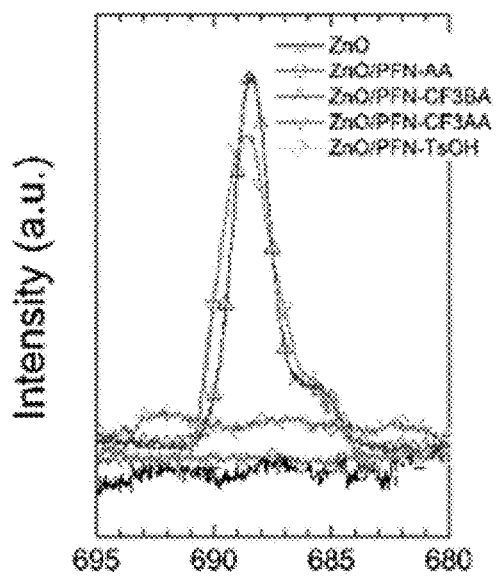
Figure 3C:
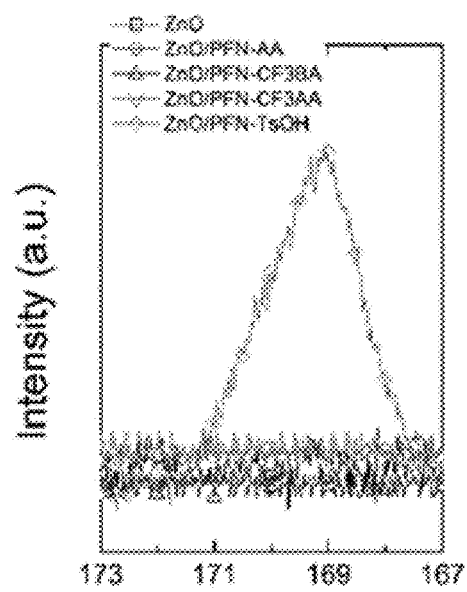

X-ray photoelectron spectroscopy (XPS) was used to examine the presence of acid derivatives on the surface of the ZnO layer. FIG. 3A shows an XPS survey spectrum of an acid derivative on the surface of the ZnO layer. The peaks at 530, 400, and 285 eV in the spectrum correspond to O1s, N1s, and C1s, respectively. The peak at 688 eV in each of the ZnO/PFN-CF3BA and ZnO/PFN-CF3AA XPS spectra corresponds to FIG. 3B. As shown in FIG. 3C, the peak at 169 eV in the ZnO/PFN-TsOH XPS spectrum corresponds to S2p. The presence of an acid-base reaction product of an acid derivative and PFN was confirmed from the XPS spectra. The peaks at 1045 and 1021 eV correspond to Zn 2p1/2 and Zn 2p3/2, respectively. The position of the peak in the spectrum of ZnO with an acid-modified PFN shifted to a higher binding energy side than the position of the peak in the spectrum of pristine ZnO that does not contain an acid-modified PFN on the surface. This means that electrons appear more abundantly around Zn atoms compared to pristine ZnO. The peaks at 532 and 530 eV in the ZnO XPS spectrum correspond to the OH group and the oxygen of ZnO, respectively. Since the peaks at 532 eV originate simultaneously from ZnO and acid derivatives, the number of defective sites in ZnO cannot be determined from the intensity of the OH peak.

According to the measurement results of the static water contact angle (SWCA) of the surface of the pristine ZnO and the SWCA of the surface of the ZnO containing PFN-acid derivative, the SWCA value of the surface of the ZnO containing PFN-acid derivative (the amount of the acid derivative is 1.0 equivalent) was greater than the SWCA value (19.08°) of the surface of the pristine ZnO. This is because the ZnO surface with the PFN-acid derivative is more hydrophobic than the pristine ZnO surface. In particular, ZnO surfaces with PFN-CF3BA and PFN-CF3AA exhibited greater SWCA values than the other ZnO surfaces due to the high hydrophobicity of the fluorine atoms. SWCA data are closely associated with the physical properties of PFN-acid derivatives and affect the photovoltaic properties of PSCs having CBLs made of respectively different combinations of acid derivatives and PFNs.

The impact of different acid derivatives on the photovoltaic properties was investigated using the inverted-type PSCs prepared in the above example. Several different amounts of acid derivatives, ranging from 0.5 to 6.0 equivalents, were tested to determine the optimal concentration of the acid derivative, and it was found that devices with PFN and a 1.0 equivalent of an acid derivative exhibited the highest power conversion efficiency (PCE). For AA, the amount of AA did not significantly affect the PCE of the device. In addition, an excess amount of each of CF3BA and TsOH did not significantly affect the PCE. This is probably because these acid derivatives are in a solid state. However, the PCE of each of the devices with PFN and 6.0 equivalents of an acid derivative was significantly lower than that of the other types of devices.

Figure 4A:
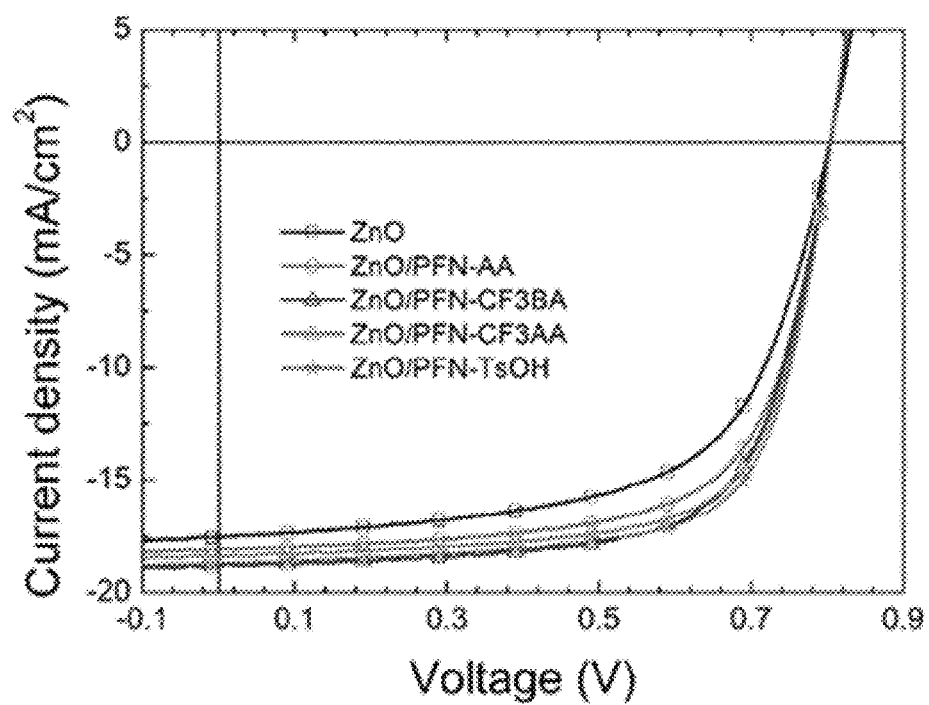
Figure 4B:
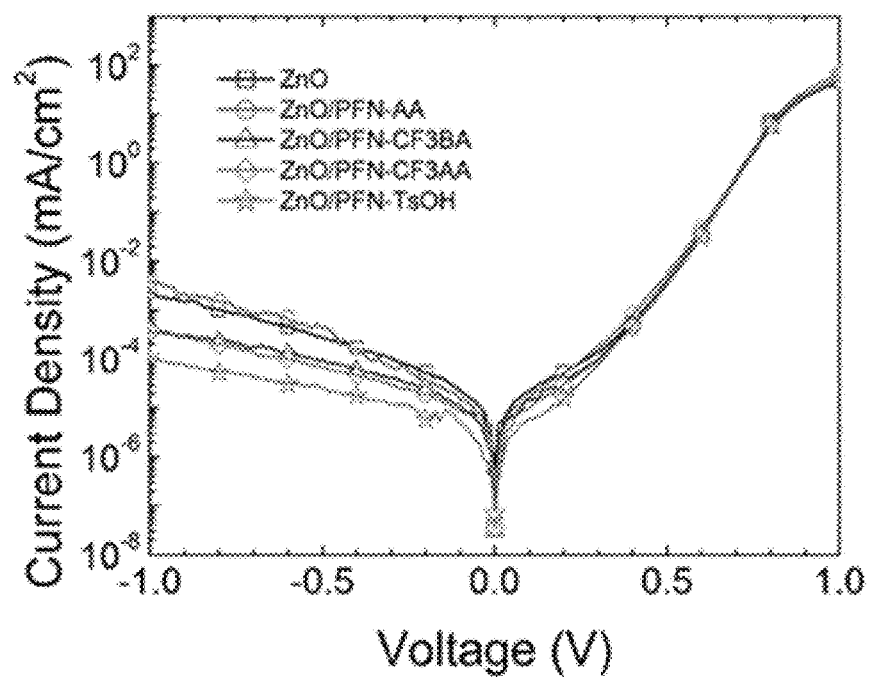

On the other hand, the surface roughness of the PFN with ZnO/6.0 equivalents of CF3AA was 5.39 nm, which was significantly greater than the surface roughness of the PFN with ZnO/1.0 equivalent of CF3AA (3.02 nm). This is because an excessive amount of liquid CF3AA deteriorates the ZnO layer. FIGS. 4A and 4B show the current density-voltage (J-V) curve of a PSC with PFN and the optimum content of an acid derivative, which exhibits the highest PCE under mock illumination. The inserted diagram represents the J-V curve in a dark state. The PCE of each of the devices respectively containing AA, CF3BA, CF3AA, and TsOH was 9.9% (short-circuit current ($J_{sc}$)=18.8 mA/cm², open-circuit voltage ($V_{oc}$)=0.80 V, and coefficient of reflection (FF)=66.5%), 10.3% ($J_{sc}$=18.8 mA/cm², $V_{oc}$=0.81 V, and FF=68.2%), 10.3% ($J_{sc}$=18.4 mA/cm², $V_{oc}$=0.81 V, and FF=69.5%), and 10.6% ($J_{sc}$=18.7 mA/cm², $V_{oc}$=0.80 V, and FF=70.6%). On the other, the PCE of the devices with pristine ZnO was 8.7% ($J_{sc}$=17.7 mA/cm², $V_{oc}$=0.80 V, and FF=61.4%). Thus, it is evident that a device based on ZnO/PFN with 1.0 equivalent of an acid derivative can achieve a remarkable improvement in PCE. In terms of power conversion efficiency (PCE), PSCs respectively based on ZnO/PFN with 1.0 equivalent of AA, ZnO/PFN with 1.0 equivalent of CF3BA, ZnO/PFN with 1.0 equivalent of CF3AA, and ZnO/PFN with 1.0 equivalent of TsOH were improved by 15.0%, 18.9%, 18.2%, and 21.4% compared to the PSC based on pristine ZnO.

Compared to the PSC with pristine ZnO, the increases in $J_{sc}$ of the PSCs respectively based on ZnO/PFN with 1.0 equivalent of AA, ZnO/PFN with 1.0 equivalent of CF3BA, ZnO/PFN with 1.0 equivalent of CF3AA, and ZnO/PFN with 1.0 equivalent of TsOH were 6.28%, 6.51%, 3.96%, and 5.77%, respectively, and the increases in FF were 8.3%, 11.1%, 13.2%, and 15.0%, respectively. That is, the simultaneous improvement of $J_{sc}$ and FF is the main factor for improvement of the efficiency of the devices. Kelvin probe microscopy (KPM) measurements of pristine ZnO and PFN-modified ZnO were performed to understand the trend in change of $J_{sc}$. The work functions of ZnO/PFN-AA (1.0 eq), ZnO/PFN-CF3BA (1.0 eq), ZnO/PFN-CF3AA (1.0 eq), and ZnO/PFN-TsOH (1.0 eq) are −4.09, −4.11, −4.07, and −4.06 eV, respectively, which are all higher than the work function (−4.29 eV) of pristine ZnO. Accordingly, the energy offset at the interface was reduced by PFN thin films containing various acid derivatives. Reduction in the energy barrier at the interface facilitated electron collection capacity. Therefore, the $J_{sc}$ values of the devices with ZnO containing PFNs and various acid derivatives were superior to those with pristine ZnO. The work function data was in line with the $J_{sc}$ trend. Meanwhile, the work function data and the $J_{sc}$ trend did not depend much on the type of acid derivative. Interestingly, the PCE and FF of the devices follow the $pK_a$ value trend of the acid derivative.

Series resistance ($R_s$) and shunt resistance ($R_{sh}$) were obtained from the J-V curves for a dark state and a 1.0 solar illumination state. In the dark state, the $R_s$ values of the devices including ZnO/PFN-AA, ZnO/PFN-CF3BA, ZnO/PFN-CF3AA, ZnO/PFN-CF3AA, and ZnO/PFN-TsOH were 2.64 Ωcm², 2.59 Ωcm², 2.48 Ωcm², and 2.12 Ωcm², respectively, which were all smaller than the $R_s$ (3.02 Ωcm²) of the device including ZnO. The $R_s$ data of the devices in the 1.0 solar state were superior to the $R_s$ data of the devices in the dark state, but the trends were identical. In addition, it was confirmed that the $R_s$ data supported the trend of FF and PCE. The $J_{sc}$ data calculated from the incident photocurrent efficiency (IPCE) curve of the devices matched well with the $J_{sc}$ data of the devices. In the 1.0 solar illumination state, the $R_{sh}$ values of the devices including ZnO/PFN-AA, ZnO/PFN-CF3BA, ZnO/PFN-CF3AA, ZnO/PFN-CF3AA, and ZnO/PFN-TsOH were 0.83 Ωcm², 1.00 Ωcm², 1.02 Ωcm², and 1.10 Ωcm², respectively, which were all larger than the $R_{sh}$ (0.58 Ωcm²) of the devices including ZnO. In addition, the $R_{sh}$ data under illumination were well matched with the tendency of the FF of the devices.

Figure 5A:
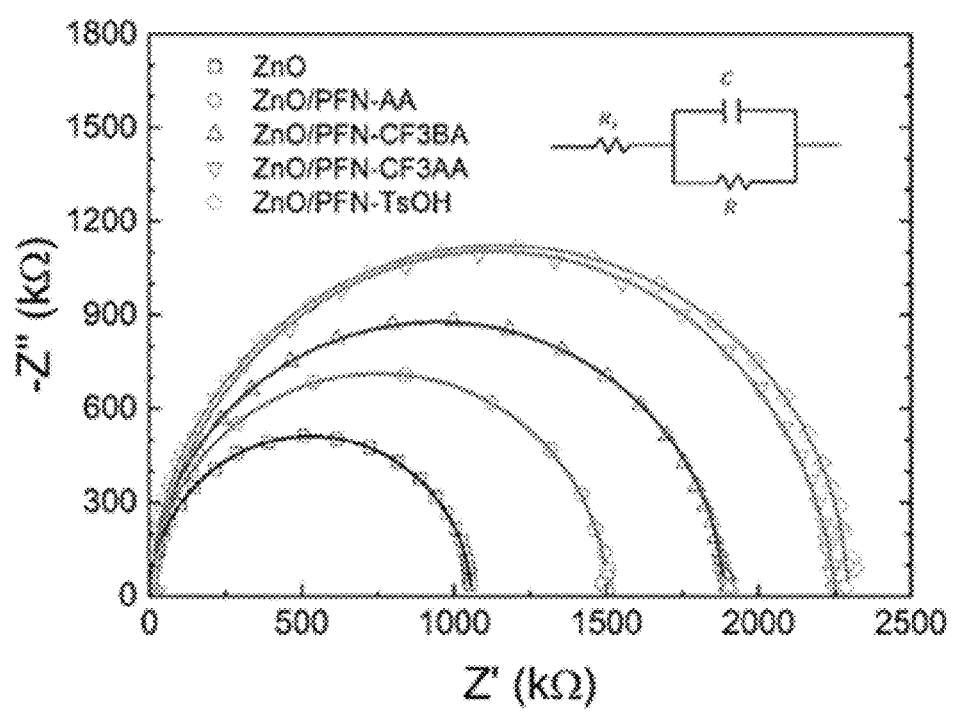
FIG. 5A illustrates an equivalent circuit for EIS spectral analysis of PSCs respectively based on ZnO and ZnO/PFN.

To observe the carrier recombination and transmission mechanisms, an electrical impedance spectrum (EIS) was obtained for each of the PSCs with ZnO and the PSCs with ZnO and a 1.0 equivalent of AA, CF3BA, CF3AA, or TsOH under dark conditions. EIS measurements were performed in a dark state at different applied voltages with frequencies ranging from 1 Hz to 1.0 MHz. FIG. 5A is a Nyquist plot at 0 V, in which a single semicircle without a transmission line was observed for each device. A transmission line usually appears when the transport resistance is less than the recombination resistance ($R_{rec}$), and the visitation of the transmission line indicates efficient charge collection. In the case of strong recombination, the EIS spectrum follows the Gerischer impedance model. The absence of a transmission line means that the device undergoes a strong charge recombination. In addition, the diameter of the semicircle represents the charge transfer resistance. The size of the EIS semicircle reflects the range of $R_{rec}$. Thus, the arc length of the EIS depends on the degree of charge recombination in the PSC. The magnitude of the $R_{rec}$ of the device increases in the order of ZnO (1150 kΩ)<ZnO/PFN-AA (1490 kΩ)<ZnO/PFN-CF3BA (1890 kΩ)<ZnO/PFN-CF3AA (2350 kΩ)<ZnO/PFN-TsOH (2365 kΩ). When the PFN modified with an acid is introduced, the size of the EIS semicircle increases, the R rec increases, and the recombination at the interface is inhibited. In particular, the device based on PFN modified with TsOH exhibited the highest $R_{rec}$ among the devices. The highest $R_{rec}$ indicates the lowest interfacial recombination, which is closely related to FF.

Figure 5B:
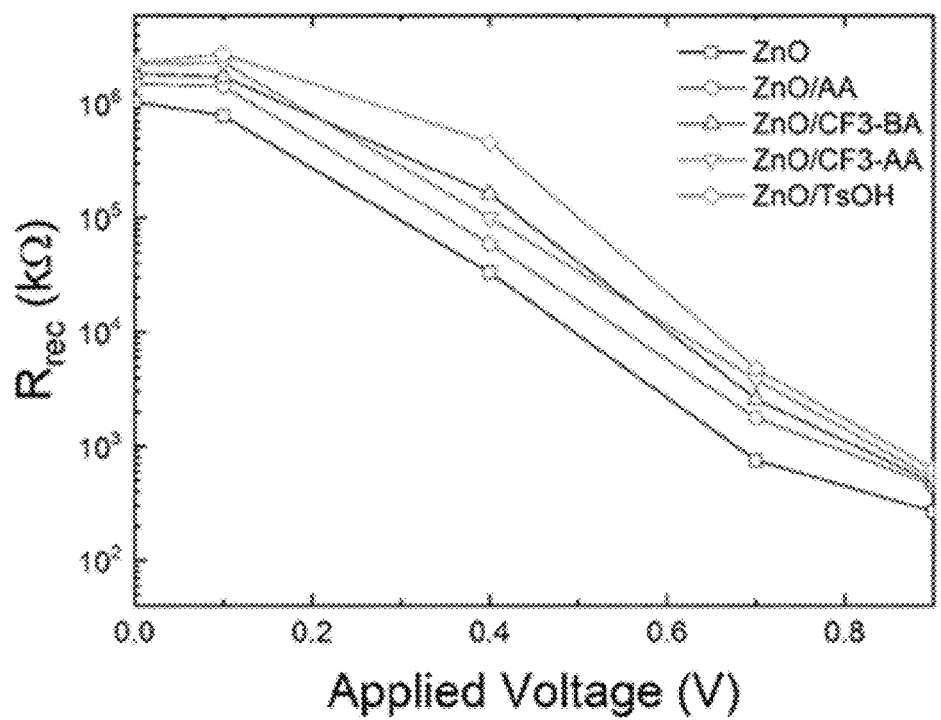
FIG. 5B illustrates a graph showing a recombination resistance value according to an application voltage.

FIG. 5B shows the result of the function of the applied voltage $R_{rec}$ in the dark state. With increasing application voltage, the $R_{rec}$ gradually decreases. This is because charge extraction is impeded at high application voltages. In terms of the $R_{rec}$, the devices based on PEN modified with an acid exhibited a higher value than the devices based on pristine ZnO at each application voltage. This result confirms that the device with PFN modified with an acid lowers charge recombination during charge transfer and charge transport. Among the devices, the device with PFN modified with TsOH exhibited the highest $R_{rec}$ at various application voltages. According to the Nyquist diagram obtained at 0 V in 1.0 solar illumination conditions for each device, the devices based on ZnO, ZnO/PFN-AA, ZnO/PFN-CF3BA, ZnO/PFN-CF3AA, and ZnO/PFN-TsOH exhibited 3.69 kΩ, 6.35 kΩ, 6.69 kΩ, 7.14 kΩ, and 7.21 kΩ, respectively, as the $R_{rec}$ value. These values are consistent with the $R_{sh}$ data under illumination and follow the trend of $R_{rec}$ in the dark state. The $R_{rec}$ values of the devices under solar illumination conditions are significantly smaller than the $R_{rec}$ values of the devices in the dark state. This is because the photo-induced charge carriers lower the $R_{rec}$ value of the device.

To examine the electron transport properties of the ZnO layer, an electron-only device (ITO/ZnO/PFN with a 1 equivalent of AA, CF3BA, CF3AA, or TsOH/Al (100 nm)) was manufactured and tested. The electron mobility of the device was calculated using the Mott-Gurney equation. The devices based on ZnO/PFN with 1.0 equivalent of AA, ZnO/PFN with 1.0 equivalent of CF3BA, ZnO/PFN with 1.0 equivalent of CF3AA, and ZnO/PFN with 1.0 equivalent of TsOH exhibited $2.73 \times 10^{-3}$ cm²V⁻²s⁻², $3.30 \times 10^{-3}$ cm²V⁻²s⁻², $3.33 \times 10^{-3}$ cm²V⁻²s⁻², $3.34 \times 10^{-3}$ cm²V⁻²s⁻² as their electron mobility, respectively. These values were all higher than the electron mobility ($2.24 \times 10^{-3}$ bm²V⁻²s⁻²) of the device based on pristine ZnO. Therefore, the $J_{sc}$ data of the devices based on ZnO/PFN modified with an acid was superior to that of the device based on pristine ZnO. However, it was found that changes in electron mobility data were not significantly dependent on the type of acid derivative, which may be the reason why $J_{sc}$ data are not significantly dependent on the type of acid derivative.

In addition, in connection with the charge transport characteristic and the charge collection characteristic of the device, the relationship between the photocurrent density $J_{ph}$ and the effective voltage $V_{eff}$ was examined. The $J_{ph}$ and $V_{eff}$ can be defined as $J_L$ (current density under illumination)–$J_D$ (current density in dark state) and $V_0$ (voltage at $J_{ph}$=0)–$V_a$ (applied voltage), respectively. The $V_{eff}$ values in the saturated photocurrent region ($V_{sat}$) of the device based on pristine ZnO and the devices respectively based on ZnO/PFN with 1.0 equivalent of AA, ZnO/PFN with 1.0 equivalent of CF3BA, ZnO/PFN with 1.0 equivalent of CF3AA, and ZnO/PFN with 1.0 equivalent of TsOH were 0.20 V, 0.18 V, 0.18 V, 0.16 V, and 0.15 V, respectively. The trend of changes in saturation voltage coincides with the trend of changes in $J_{sc}$ because the smaller $V_{sat}$, the faster transition from the space-charge-limited regime to the saturated regime.

Saturation current density ($J_{sat}$) at a high effective voltage $V_{eff}$ may be correlated with a maximum exciton generation rate ($G_{max}$), an exciton dissociation probability, and a carrier transport and collection probability. The $G_{max}$ was calculated using the formula "$J_{ph}$/q·L" (where q and L represent the electron charge and thickness of the active layer, respectively). The $G_{max}$ is related to the light absorption of the active layer. The $G_{max}$ value in the $J_{sat}$ conditions of the device based on pristine ZnO was $1.60 \times 10^{28}$ cm⁻³s⁻¹, and the $G_{max}$ values in the $J_{sat}$ conditions of the devices respectively based on ZnO/PFN with 1.0 equivalent of AA, ZnO/PFN with 1.0 equivalent of CF3BA, ZnO/PFN with 1.0 equivalent of CF3AA, and ZnO/PFN with 1.0 equivalent of TsOH were $1.61 \times 10^{28}$ cm⁻³s⁻¹, $1.68 \times 10^{28}$ cm⁻³s⁻¹, $1.64 \times 10^{28}$ cm⁻³s⁻¹, and $1.66 \times 10^{28}$ cm⁻³s⁻¹, respectively. Since the $G_{max}$ is dependent on the absorbance of the active layer, no significant change in $G_{max}$ was observed. When all photo-generated excitons are separated into free charge carriers at high $V_{eff}$, the $J_{sat}$ is limited by carrier transport and collection. Accordingly, the carrier transport and collection probability at an arbitrary $V_{eff}$ can be estimated from the ratio of $J_{ph}/J_{sat}$. In the $J_{ph}$ saturated region where the saturated current density ($J_{sat}$) is estimated from the convergence value of $J_{ph}$, the $J_{ph}/J_{sat}$ ratio values of the PSCs based on ZnO/1.0 equivalent of AA, ZnO/1.0 equivalent of CF3BA, ZnO/1.0 equivalent of CF3AA, and ZnO/1.0 equivalent of TsOH were 94.1%, 94.5%, 94.9%, and 95.2%, respectively, which are all higher than the $J_{ph}/J_{sat}$ value (90.1%) of the device based on pristine ZnO. This is because PFN modified with an acid improve the carrier transport and collection of the device.

The trend in the $J_{ph}/J_{sat}$ data of the device with the ZnO modified with an acid follows the trend of the performance of the device.

Figure 6A:
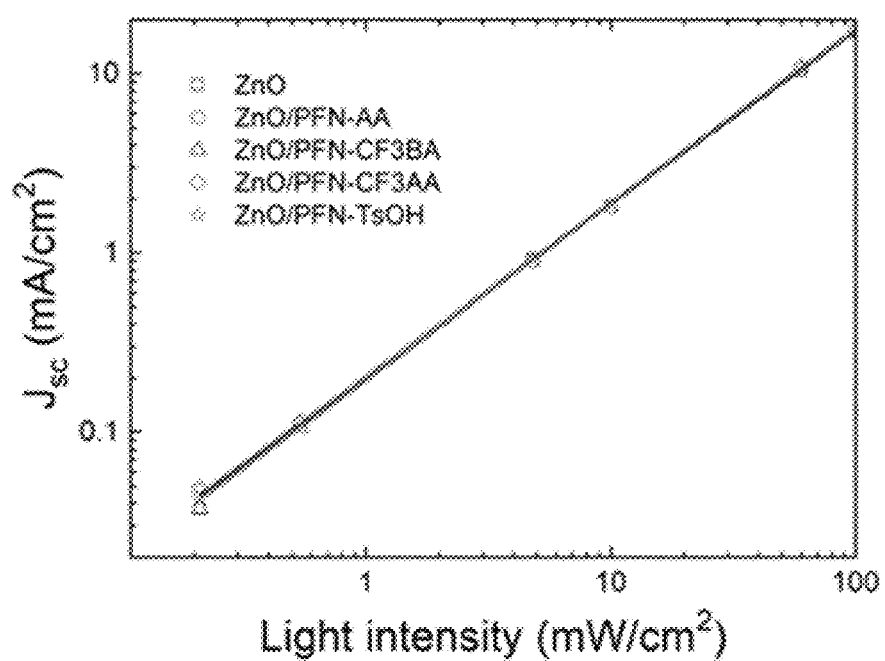

To examine the charge recombination kinetics at the interface, $J_{sc}$ and $V_{oc}$ of the device were represented as the function of illumination intensity. The relationship between $J_{sc}$ and illumination intensity is generally defined as $J_{sc} \propto I^{\alpha}$ (where I represents illumination intensity). When α is 1, the device exhibits complete bimolecular recombination in short-circuit conditions. As shown in FIG. 6A, the α values of the devices respectively based on ZnO/PFN with 1.0 equivalent of AA, ZnO/PFN with 1.0 equivalent of CF3BA, ZnO/PFN with 1.0 equivalent of CF3AA, and ZnO/PFN with 1.0 equivalent of TsOH are 0.98, 0.98, 0.98, and 0.97, respectively, which are similar to the α value (0.96) of device with pristine ZnO. This means that the devices exhibit slight bimolecular recombination due to the reduction in the spatial charge at the interface. However, the α values were not dependent on the type of acid derivative. This result is consistent with the $J_{sc}$ and tendency of electron mobility of the devices.

Figure 6B:
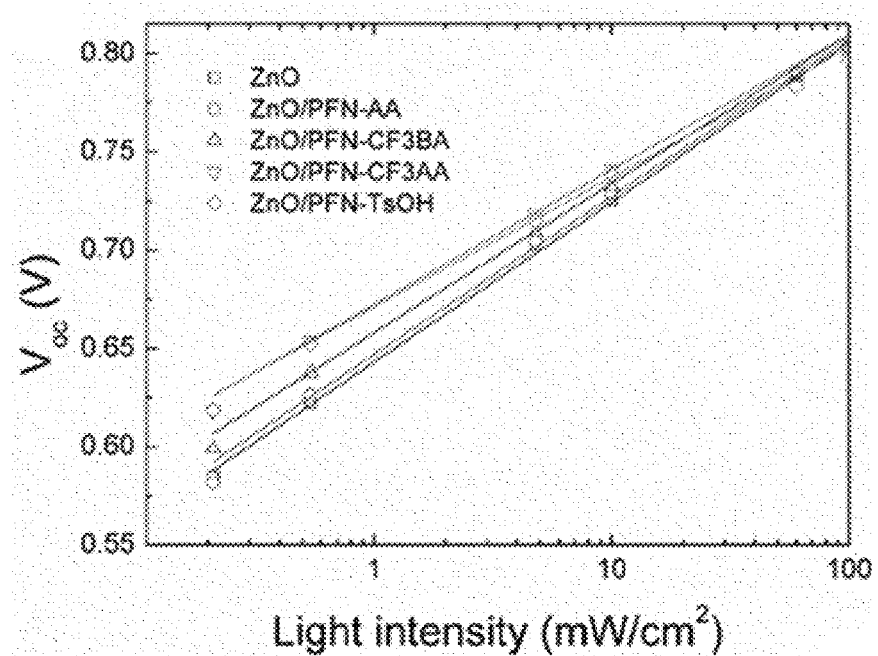

FIG. 6B shows $V_{oc}$ as a function of illumination intensity (I), in which the relationship between $V_{oc}$ and the illumination intensity is defined as $V_{oc} \propto skT/q \cdot \ln(I)$ where k, T, and q are Boltzmann constant, Kelvin temperature, and electron charge, respectively. When the device has only a trap-assisted recombination channel, the value of s is 2. When the device has only a band-to-band recombination channel, the value of s is 1. The s values of the devices respectively based on ZnO/1.0 equivalent of AA, ZnO/1.0 equivalent of CF3BA, ZnO/1.0 equivalent of CF3AA, and ZnO/1.0

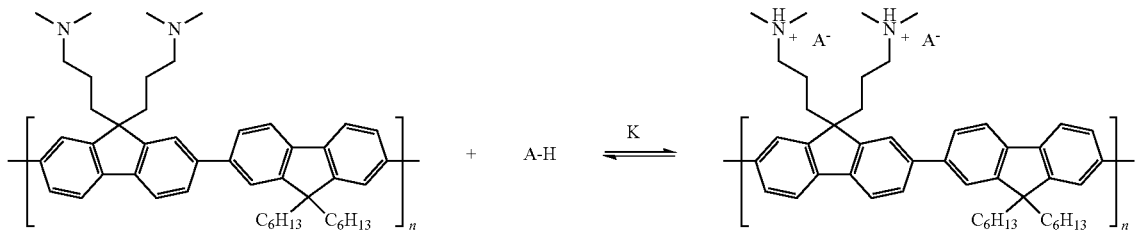

equivalent of TsOH were 1.36, 1.28, 1.16, and 1.12, respectively, which were all less than the s value (1.37) of the device based on pristine ZnO. Thus, the devices exhibited reduction in the trap-assisted recombination. The change in the s value of the device is well in consistent with the trend of PCE and follows the trend of the $pK_a$ value of the acid derivative.

In addition, after the devices were stored for 800 hours in a nitrogen filled globe box without passivation treatment, the PCEs of the devices respectively based on ZnO, ZnO/PFE with 1.0 equivalent of AA, ZnO/PFE with 1.0 equivalent of CF3BA, ZnO/PFE with 1.0 equivalent of CF3AA, and ZnO/PFE with 1.0 equivalent of TsOH were found to be 97%, 97%, 94%, 97%, and 96% of the initial PCE. This shows that the acidity of the additive does not significantly affect the device stability. However, devices with an excessive amount of an acid derivative were found to be less stable than devices with a 1.0 equivalent of the acid derivative. The PCEs of the devices respectively with 1.0 equivalent of AA, CF3BA, CF3AA, and TsOH were 88%, 89%, 90%, and 87% of the initial PCE, respectively after 800 hours. Meanwhile, after 800 hours, the PCE of the device based on pristine ZnO was 91%.

While exemplary embodiments of the present disclosure have been described with reference to the accompanying drawings, those skilled in the art will appreciate that the present disclosure can be implemented in other different forms without departing from the technical spirit or essential characteristics of the exemplary embodiments. Therefore, it can be understood that the exemplary embodiments described above are only for illustrative purposes and are not restrictive in all aspects.

The cathode buffer layer included in a polymer solar cell (PSC), according to the present disclosure, is made of a conjugated polymer electrolyte (PFN) modified with a specific acid derivative. Therefore, both of the short-circuit current ($J_{sc}$) and the charge factor (FF) of the device can be improved. Therefore, polymer solar cells (PSC) with a greatly improved efficiency than conventional solar cells can be obtained.

What is claimed is:

1. A polymer solar cell (PCS) comprising a cathode buffer layer (CBL) made of a reaction product of a conjugate polymer electrolyte and an acid derivative, wherein the conjugated polymer electrolyte is poly[(9,9-bis(3'-(N, N-dimethylamino)propyl)-2,7-fluorene)-alt-2,7-(9,9-dihexylfluorene)] (PFN), and the acid derivative is 4-toluene sulfonic acid (TsOH).

2. The polymer solar cell according to claim 1, wherein a reaction between the PFN with the acid derivative is performed according to the following chemical reaction formula:

(where A-H represents

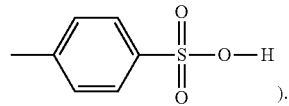

).

3. The polymer solar cell according to claim 1, wherein the polymer solar cell is an inverted polymer solar cell in which an ITO substrate, a zinc oxide (ZnO) layer, the cathode buffer layer (CBL) comprising PFN modified with an acid derivative, an active layer comprising PTB7-Th and $PC_{71}BM$, a molybdenum oxide ($MoO_3$) layer, and an silver electrode layer are stacked in this order.

* * * * *